United States Patent [19]

Mueller

[11] 4,355,407
[45] Oct. 19, 1982

[54] DEVICE FOR DISCONNECTING THE RECEIVER IN CASE OF A SMALL SIGNAL-TO-NOISE RATIO FOR A DIGITAL-MODULATED RADIO SYSTEM

[75] Inventor: Friedrich Mueller, Munich, Fed. Rep. of Germany

[73] Assignee: Siemens Aktiengesellschaft, Berlin & Munich, Fed. Rep. of Germany

[21] Appl. No.: 239,572

[22] Filed: Mar. 2, 1981

[30] Foreign Application Priority Data

Mar. 3, 1980 [DE] Fed. Rep. of Germany ....... 3008076

[51] Int. Cl.$^3$ ...................... H04L 27/14; H04B 3/60; H04B 1/10; H04B 17/00
[52] U.S. Cl. ................................. 375/91; 324/57 N; 375/104; 455/56; 455/222; 455/225; 455/303
[58] Field of Search .......................... 375/91, 100, 104; 455/52, 54, 56, 67, 134, 135, 140, 222, 225, 277, 303, 226; 324/57 N

[56] References Cited

U.S. PATENT DOCUMENTS 3,155,909 11/1964 Shepherd ............................. 455/56
3,383,600 5/1968 Calfee ................................... 375/91
3,766,479 10/1973 Thalimer et al. .................. 375/104
3,947,769 3/1976 Rousos et al. ........................ 375/91
4,125,809 11/1978 Mott ...................................... 455/67
4,209,749 6/1980 Becker et al. .......................... 455/56

Primary Examiner—Marc E. Bookbinder
Attorney, Agent, or Firm—Hill, Van Santen, Steadman, Chiara & Simpson

[57] ABSTRACT

Rapid disconnection of a receiver in response to a small signal-to-noise ratio is provided in that in the receiver there is arranged a FSK demodulator having two channels connected in parallel at the input ends and each having a band-pass filter, an amplifier and a detector whose output is connected to a voltage comparator. The output signal of the voltage comparator is fed to an input of an AND gate in the receiving arm by way of a series arrangement of a high-pass circuit, a demodulator and a low pass filter to the inverting input of a further comparator whose non-inverting input is connected to a comparison voltage by way of a variable voltage divider. The output of the further comparator is connected to the other input of the AND gate.

4 Claims, 2 Drawing Figures

DEVICE FOR DISCONNECTING THE RECEIVER IN CASE OF A SMALL SIGNAL-TO-NOISE RATIO FOR A DIGITAL-MODULATED RADIO SYSTEM

BACKGROUND OF THE INVENTION

1. Field of the Invention

The present invention relates to a device for disconnecting the receiver in the case of a small signal-to-noise ratio for a digital-modulated radio system, in particular a radio system for transmitting communications between transmitting/receiving stations which move along predetermined paths and transmitting/receiving stations arranged at predetermined intervals along these paths.

2. Description of the Prior Art

In a radio system of the type mentioned above for the transmission of communications between transmitting-/receiving stations moving along predetermined paths and transmitting/receiving stations arranged at predetermined intervals along such paths, as is known for example through the German published application No. 26 44 206, which corresponds to U.S. Pat. No. 4,209,749, and which is fully incorporated herein by this reference, a plurality of stationary transmitting/receiving stations can receive identical communications signals from a mobile transmitting/receiving station. A plurality of stationary transmitting/receiving stations can be connected in parallel in respect of their receiver outputs, so that those transmitting/receiving stations which are currently not receiving any item of communication as a result of the transmission emit a fixed zero level, although the communications signal of those transmitting/receiving stations which are currently receiving communications is not disturbed. Also, however, if a predetermined minimum signal-to-noise ratio S/N is undershot as a result of the transmission, the individual transmitting/receiving stations are to emit the output signal zero. As in the case of mobile radio systems, very rapid level fluctuations naturally occur, so that the disconnection procedure must also be sufficiently rapid relative to the data rate of the binary communication which is to be transmitted.

SUMMARY OF THE INVENTION

The object of the present invention is to provide a device for disconnecting the receiver in the case of a low signal-to-noise ratio which ensures a rapid disconnection corresponding to the above-described requirements.

This object is achieved according to the invention in that the receiver contains a frequency shift keyed (FSK) demodulator comprising two channels which are connected in parallel at their input and which each have a band-pass filter, an amplifier, and a detector which at their output end are connected to a voltage comparator whose output signal is fed to an input of an AND gate located in the receiving path and, moreover, by way of the series arrangement of a high-pass circuit, a detector, and a low-pass filter, to the inverting input of a further comparator whose non-inverting input is connected by way of a variable voltage divider to a comparison voltage and whose output is connected to the other input of the AND gate.

Advantageously, a voltage-regulated preliminary amplifier which serves to maintain constant the output voltage of the two FSK channels with any S/N ratio is connected in the receiving arm between the receiving mixer and the FSK demodulator.

BRIEF DESCRIPTION OF THE DRAWING

Other objects, features and advantages of the invention, its organization, construction and operation will be best understood from the following detailed description, taken in conjunction with the accompanying drawing, on which.

DESCRIPTION OF THE PREFERRED EMBODIMENTS

Figure 1:
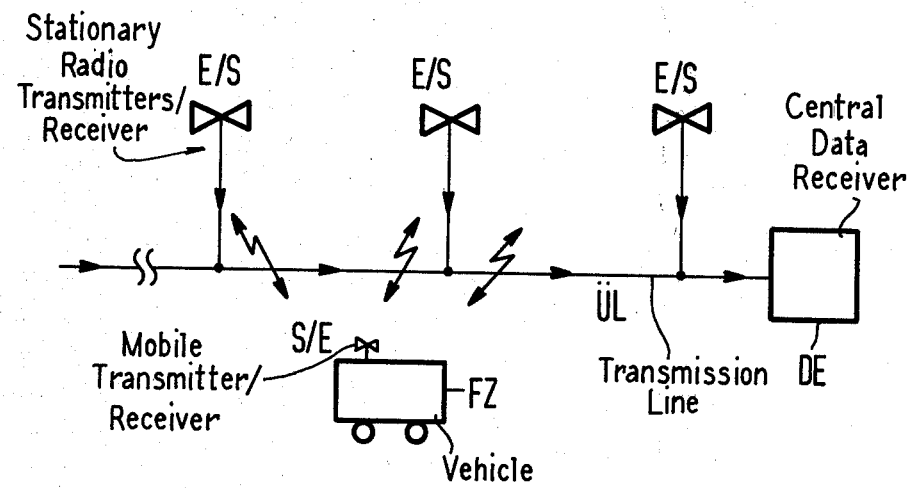
FIG. 1 is a schematic representation of a mobile radio system.

In the radio system illustrated in FIG. 1, radio receivers (transmitters) E/S are arranged at predetermined intervals along a transmission path and are radio-linked to a radio transmitter (receiver) arranged on a vehicle FZ which is moving therepast. The items of communication received by the stationary radio receivers (transmitters) E/S are fed via a transmission line UL to a central data receiver DE.

Figure 2:
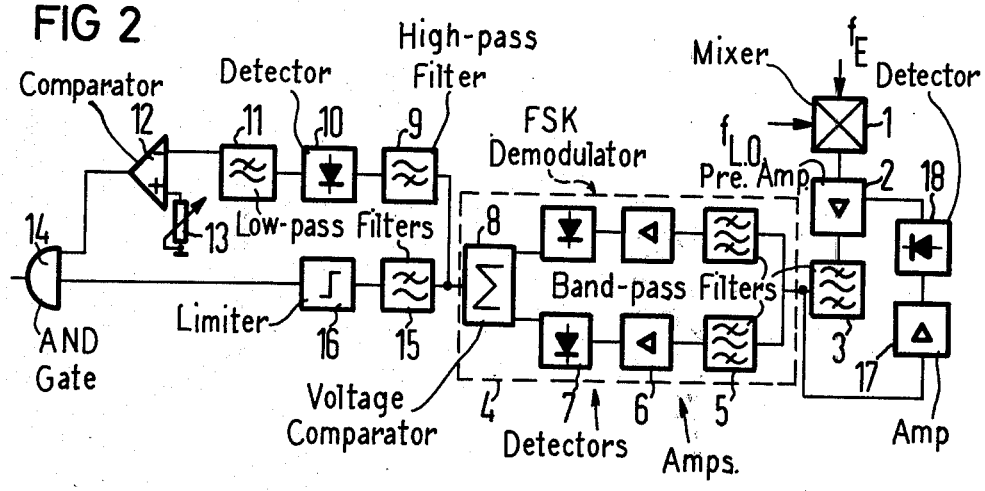
FIG. 2 illustrates the receiver disconnection facilities in accordance with the present invention.

The receiving component of the stationary transmitting/receiving station and the receiver disconnection facilities are illustrated in FIG. 2. The received signal which possesses the frequency $f_E$ is fed to a receiving mixer 1 in which the intermediate frequency is produced with the local oscillator frequency $f_{LO}$. The receiving mixer 1 is followed by a voltage-regulated preliminary amplifier 2 and a band-pass filter 3. The band-pass filter 3 is connected to a FSK demodulator 4 (within broken lines) which comprises two channels which are connected in parallel at the input ends, each comprising a series arrangement of a band-pass filter 5, an amplifier 6 and a detector 7. At the output end, the two channels are connected to a voltage comparator 8. The output of the bandpass filter 3 is further connected to the voltage-regulated preliminary amplifier 2 via an amplifier 17 and a detector 18, which produces a d.c. voltage. The output of the comparator 8 is connected, on the one hand, by way of a highpass filter 9, a detector 10 and a low-pass filter 11 to the inverting input of a further comparator 12, whose non-inverting input is connected to a comparison voltage by way of a variable voltage divider 13. The output of the comparator 12 is connected to an input of an AND gate 14 located in the receiving path. The second input of the AND gate 14 is connected to the output of the comparator 8 by way of a low-pass filter 15 and a limiter circuit 16.

The operation of the disconnection device will be explained in the following. In the receiving component, in the event of an adequate signal-to-noise ratio S/N in the FSK demodulator the signal which is emitted in the timing of the received modulation alternately from the one and then the other FSK channel reverses the voltage comparator 8. With a falling signal-to-noise ratio S/N, to an increasing extent, individual noise peaks which are superposed upon the communications signal arise in the two FSK channels and result in an additional switchover of the voltage comparator 8. If the S/N ratio becomes even smaller, an increase occurs in the frequency of the noise peaks and thus also in the frequency of the comparator switchover. Since the voltage-regulated preliminary amplifier 2 maintains constant the output voltage of the two FSK channels with any S/N ratio, in the case of a totally interrupted reception, both channels emit a noncorrelated highly-amplified noise signal and, thus, reverse the voltage comparator 8 at a high frequency. In this manner, following appropriate frequency-voltage conversion of the output signal of the voltage comparator 8, it is possible to acquire a signal which is inversely proportional to the S/N ratio. This takes place in that the output signal of the voltage comparator is fed to the detector 10 by way of the high-pass circuit 9. The d.c. voltage which has been formed following the low-pass filter 11 which is connected to the output of the detector and which is proportional to the frequency of the signal which has occurred across the voltage comparator 8 and, therefore, inversely proportional to the S/N ratio, is fed to the inverting input of the comparator 12 whose non-inverting input is connected by way of the variable voltage divider 13 to a comparison voltage. With the adjustable comparison voltage it is possible to set the S/N ratio at which the voltage comparator 8 emits the output level zero and, therefore, switches the AND gate 14 which blocks the receiving path. Because of the high frequency noise signal analysis, the disconnection takes place very rapidly (disconnect time is a few μsec).

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. Apparatus for disconnecting a receiver in response to a small signal-to-noise ratio in a digital modulated radio system, comprising:
   a receiving mixer operable to receive a transmitted radio signal and convert the same to an intermediate frequency;
   a frequency shift keyed demodulator comprising an input coupled to said mixer, two channels each including in series a band-pass filter connected to said input, an amplifier and a detector, and a voltage comparator connected to said detectors and operable to be switched at a frequency which increases with decreasing signal-to-noise ratio;
   an AND gate;
   connecting means connecting said voltage comparator to said AND gate; and
   frequency-to-voltage conversion means for obtaining a voltage which is inversely proportional to the signal-to-noise ratio connected between said voltage comparator and said AND gate and including in series a high-pass filter, a detector and a further comparator having a first input connected to said last-mentioned detector and a second input, and a variable voltage divider connected to said second input for setting a minimum acceptable signal-to-noise ratio,
   said AND gate operated to disconnect the receiver in response to signal-to-noise ratios less than the set minimum.

2. The apparatus of claim 1, and further comprising:
   voltage-regulated preliminary amplifier means connecting said mixer to said frequency shift keyed demodulator for maintaining the outputs of the two channels constant at any signal-to-noise ratio.

3. The apparatus of claim 2, wherein said preliminary amplifier means comprises:
   a voltage controlled preliminary amplifier including an input, a control input and an output;
   a band-pass filter connected between said output and said input of said frequency shift keyed demodulator;
   a further amplifier connected to the output of said bandpass filter; and
   a detector connected between said further amplifier and said control input.

4. The apparatus of claim 1, wherein said connecting means comprises:
   a low-pass filter connected to said voltage comparator; and
   a limiter connecting said low-pass filter to said AND gate.

* * * * *